United States Patent
Lin et al.

(10) Patent No.: US 6,821,127 B2
(45) Date of Patent: Nov. 23, 2004

(54) SOCKET ASSEMBLY WITH VACUUM PICKUP CAP

(75) Inventors: Nick Lin, Tu-Chen (TW); Fang-Jwu Liao, Tu-Chen (TW); Hsiang-Ping Chen, Tu-Chen (TW); Chi-Hung Liu, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 119 days.

(21) Appl. No.: 10/287,932

(22) Filed: Nov. 4, 2002

(65) Prior Publication Data

US 2003/0194891 A1 Oct. 16, 2003

(30) Foreign Application Priority Data

Apr. 12, 2002  (TW) .................................... 91204871 U

(51) Int. Cl.⁷ ............................................ H01R 13/06
(52) U.S. Cl. ........................................ 439/41; 439/940
(58) Field of Search .......................... 439/41, 135, 940, 439/342

(56) References Cited

U.S. PATENT DOCUMENTS

| | | | |
|---|---|---|---|
| 4,645,278 A | * | 2/1987 | Yevak et al. ................ 439/135 |
| 5,383,797 A | * | 1/1995 | Seong et al. ................ 439/135 |
| 5,651,684 A | * | 7/1997 | Northey et al. ............... 439/41 |
| 5,819,404 A | * | 10/1998 | Whiting ...................... 439/940 |
| 6,290,805 B1 | * | 9/2001 | Freund et al. .............. 438/464 |
| 6,328,574 B1 | * | 12/2001 | Howell et al. ................ 439/70 |
| 6,337,489 B1 | * | 1/2002 | Matsumoto et al. .......... 29/740 |
| 6,554,625 B1 | * | 4/2003 | Liao et al. .................. 439/135 |
| 6,558,174 B1 | * | 5/2003 | Hou .......................... 439/135 |

\* cited by examiner

*Primary Examiner*—P. Austin Bradley
*Assistant Examiner*—Felix O. Figueroa
(74) *Attorney, Agent, or Firm*—Wei Te Chung

(57) ABSTRACT

A socket assembly (1) includes a socket (2) and a vacuum pickup cap (3). The socket includes a base (20), a cover (21) movably assembled upon the base and an actuating rod (22) assembled on both the base and the cover for driving the cover to move in relative to the base. The cover defines a through hole (200) in a center thereof. The vacuum pickup cap includes a flexible bottom plate (31) and a flexible film (32). The flexible bottom plate has a sticky bottom surface (310) adhered to an upper surface of the cover and covering the through hole of the cover. The flexible film has a sticky bottom surface (320) adhered to the flexible bottom plate and a smooth upper surface (321) adapted for being sucked by a vacuum pickup device.

13 Claims, 5 Drawing Sheets

SOCKET ASSEMBLY WITH VACUUM PICKUP CAP

CROSS-REFERENCE TO RELATED APPLICATIONS

This patent application is a Co-pending Application of patent application Ser. No. 10/126,219, entitled "PICK UP DEVICE USED FOR AN ELECTRICAL SOCKET", filed on Apr. 18, 2002, invented by Bono Liao et al.; Ser. No. 10/041,096, entitled "PICK-AND-PLACE DEVICE OF CPU SOCKET", filed on Dec. 28, 2001, invented by Sung-Pei Hou and Ser. No. 10/071/550, entitled "VACUUM PICKUP CAP FOR USE WITH ELECTRICAL CONNECTOR", filed on Feb. 8, 2002, invented by Bob Mchugh et al., all assigned to the same assignee as this patent application.

BACKGROUND OF THE INVENTION

1. Field of the Invention

The present invention relates to a socket assembly, and particularly to a socket assembly with a vacuum pickup cap.

2. Description of Related Art

As the technology develops, manual assembling is replaced by automatic assembling. In general, during the automation of assembling an electrical connector to a printed circuit board, frequently, a vacuum pickup device is used to pick up the electrical connector from one position to another position. However, referring to U.S. Pat. Nos. 6,290,805, 6,328,574, 5,651,684, 5,819,404 and 6,337,489, when picked up by a vacuum pickup device, the electrical connector has to define a smooth surface for being sucked by the pickup device. An article entitled "MicroPGA packages" which is shown in Page 92 of Electronic Design published on Jan. 7, 2002 discloses a socket for a Central Processor Unit (CPU). The socket defines a rectangular through hole in a center thereof for dissipating heat produced by the CPU; therefore, the socket cannot be directly sucked by a vacuum pickup device. Generally, the socket is provided with a vacuum pickup cap for being sucked by the vacuum pickup device.

Referring to FIG. 4, a related vacuum pickup cap 3 is made of a transparent flexible film. The vacuum pickup cap 3 is adhered to an upper surface of a socket 4 for being sucked by a vacuum pickup device (not shown) to move the socket 4 from one position to another. However, since the socket 4 defines a rectangular through hole 40 in a center thereof, there is no solid structure in the center of the socket 4 for the vacuum pickup cap 3 to adhere to. The vacuum pickup cap 3 must have a thickness large enough so that it is strong to not to deform when the vacuum pickup device applies a vacuum force to the pickup cap 3. A thick pickup cap is costly.

FIG. 5 discloses another related vacuum pickup cap 5 which is made of plastic. The vacuum pickup cap 5 defines a pair of through holes 51 near a center thereof. The vacuum pickup cap 5 comprises a pair of spring arms (not shown) on a bottom surface thereof for engaging with a socket 6. Since the vacuum pickup cap 5 has two through holes 51, the area of the vacuum pickup cap 5 usable for a sucker of a vacuum pickup device (not shown) is limited in the largest internally tangent circle A (shown in broken line). This reduces the sucking force of the vacuum pickup device. In addition, the vacuum pickup cap 5 is assembled to the socket 6 by spring arms, which is disadvantageous from the view of automatic assembling the pickup cap 5 to the socket 6.

Hence, an improved vacuum pickup cap is required to overcome the disadvantages of the related vacuum pickup caps.

SUMMARY OF THE INVENTION

Accordingly, an object of the present invention is to provide a socket assembly with a vacuum pickup cap which can be automatically assembled to a socket and which can decrease the material cost.

In order to achieve the above object, a socket assembly includes a socket and a vacuum pickup cap. The socket includes a base, a cover movably assembled upon the base and an actuating rod assembled on the base and the cover for driving the cover to move relative to the base. The cover defines a through hole in a center thereof. The vacuum pickup cap includes a flexible bottom plate and a flexible film. The flexible bottom plate has a sticky bottom surface adhered to an upper surface of the cover and covering the through hole of the cover. The flexible film has a sticky bottom surface adhered to the flexible bottom plate, and a smooth upper surface adapted for being sucked by a vacuum pickup device.

Other objects, advantages and novel features of the invention will become more apparent from the following detailed description when taken in conjunction with the accompanying drawings.

DETAILED DESCRIPTION OF THE INVENTION

Figure 1:
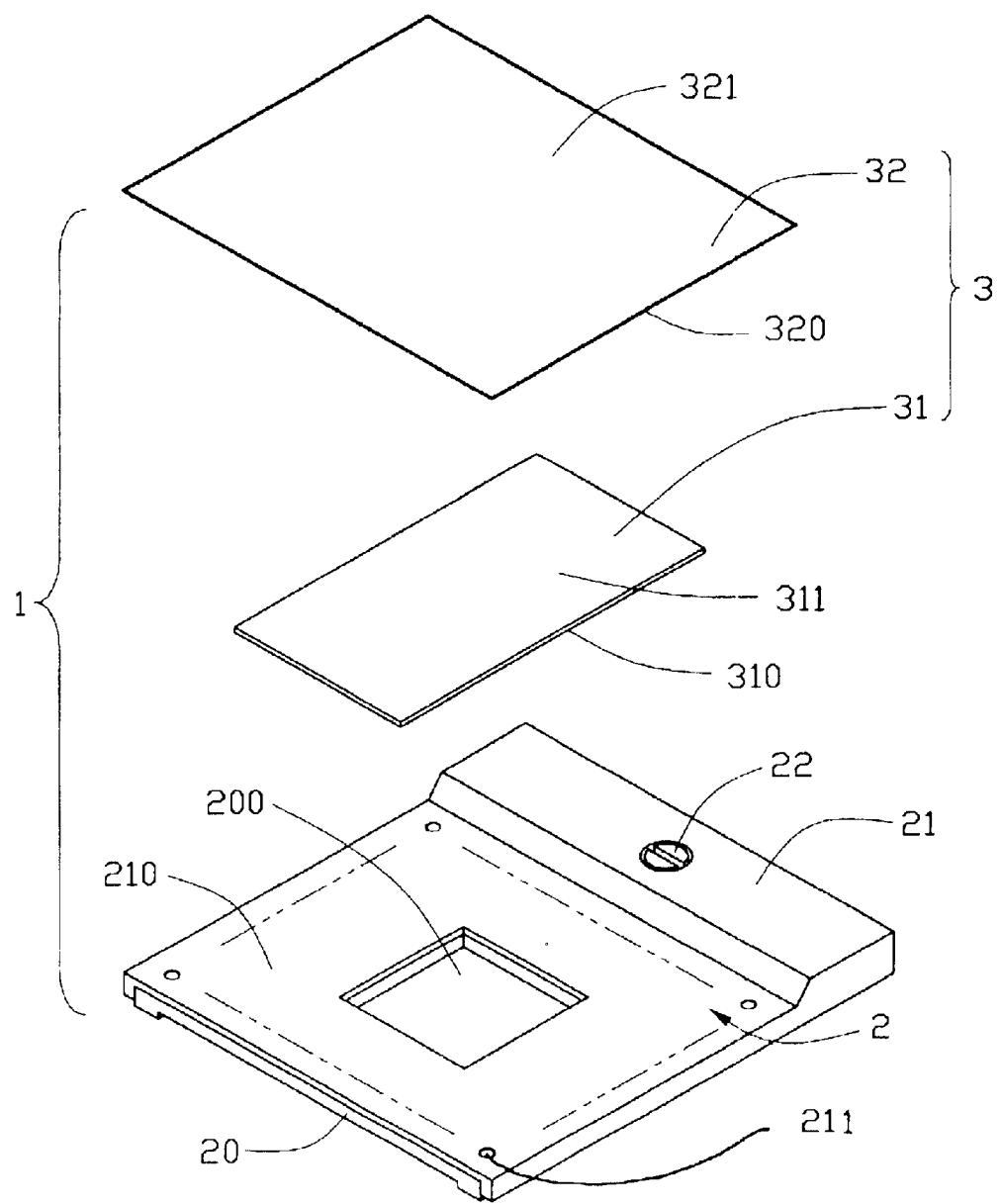
FIG. 1 is an exploded, perspective view of a socket assembly including a socket, a paper tape and a vacuum pickup film in accordance with the present invention.

Reference will now be made to the drawing figures to describe the present invention in detail.

Referring to FIG. 1, a socket assembly 1 of the present invention comprises a socket 2 and a vacuum pickup cap 3 to be adhered to the socket 2. The vacuum pickup cap 3 is for being sucked by a vacuum pickup device (not shown) to move the socket 2 from one place to another.

The socket 2 is used for electrically connecting an integrated circuit (IC) package (not shown) with a printed circuit board (not shown). The socket 2 comprises a base 20, a cover 21 movably assembled upon the base 20 with through holes 211 therein, and an actuating rod 22. The actuating rod 22 is assembled on both the base 20 and the cover 21 for driving the cover 21 to move relative to the base 20. The base 20 and the cover 21 each define a rectangular through hole 200 in a center thereof for well dissipating heat produced by the IC package. In addition, the cover 21 comprises an upper surface 210.

Figure 2:
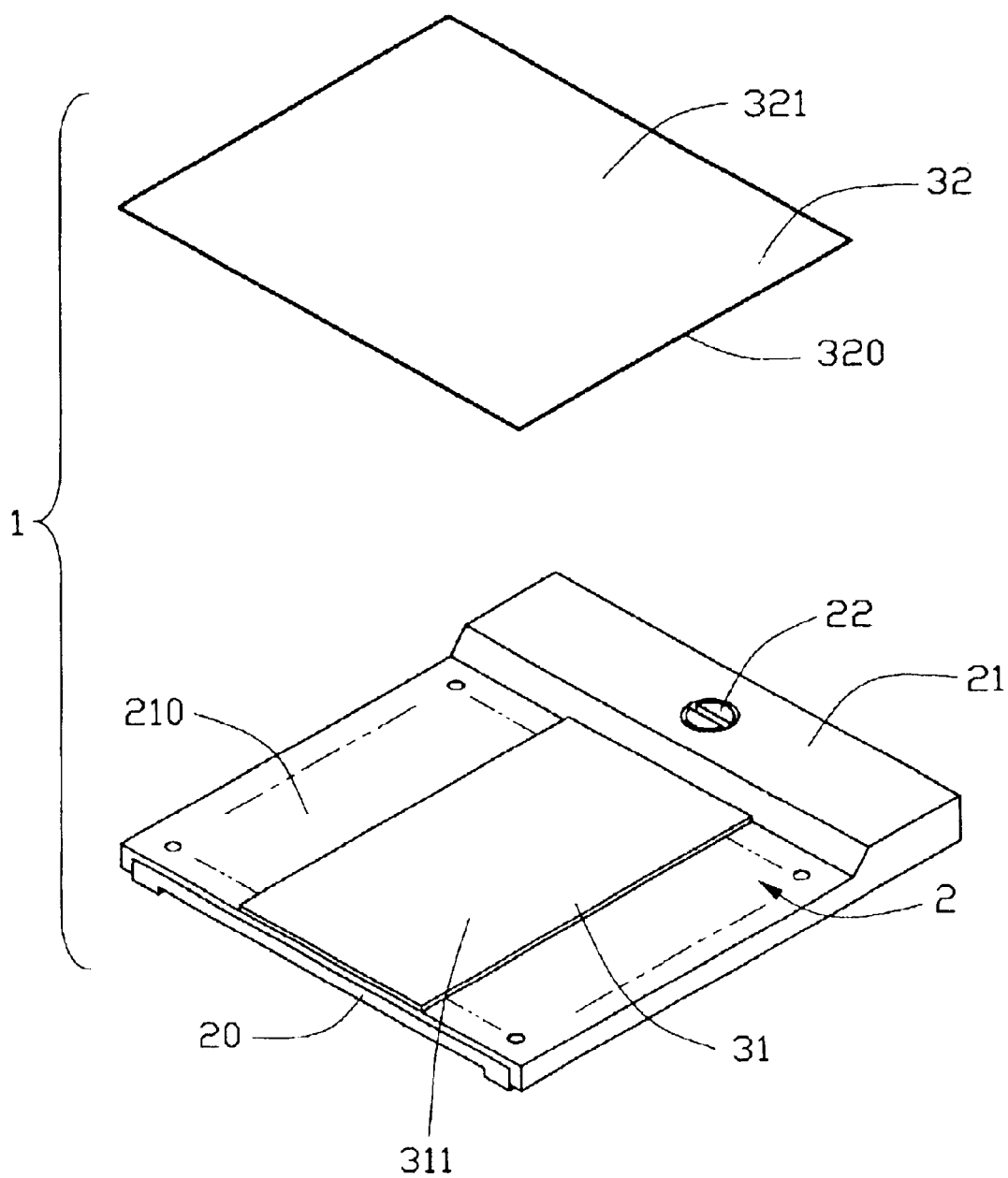
FIG. 2 is a view similar to FIG. 1 with that the paper tape is adhered to the socket while the vacuum pickup film is not.
Figure 3:
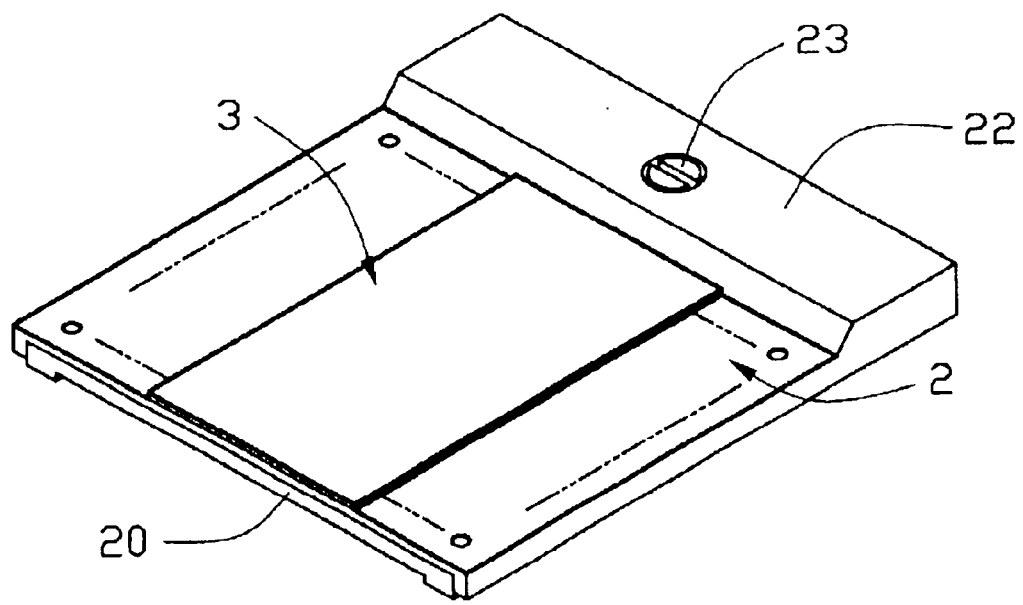
FIG. 3 is an assembled view of FIG. 1.
Figure 4:
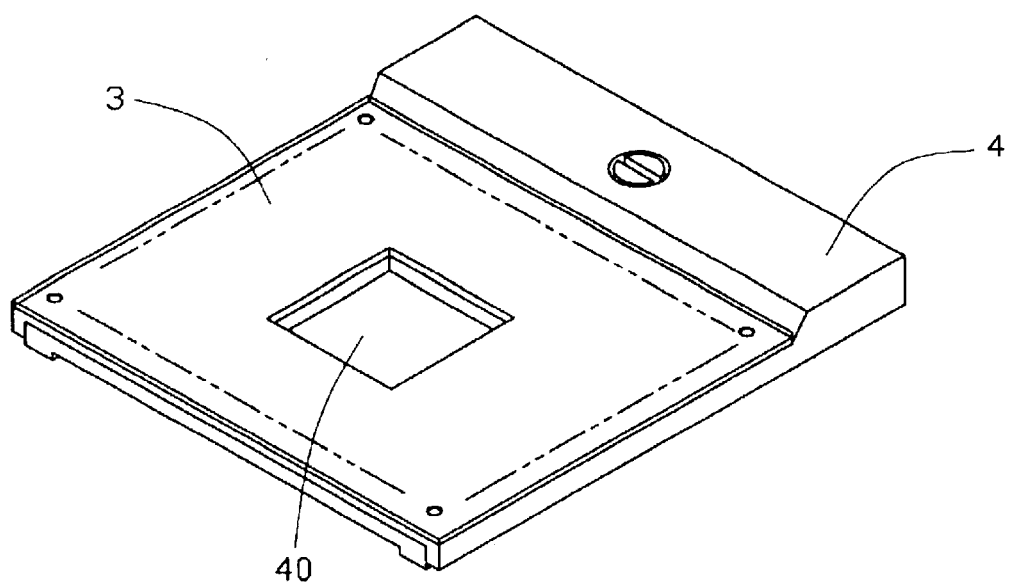
FIG. 4 is a perspective view of a socket and a related vacuum pickup cap adhered to the socket.
Figure 5:
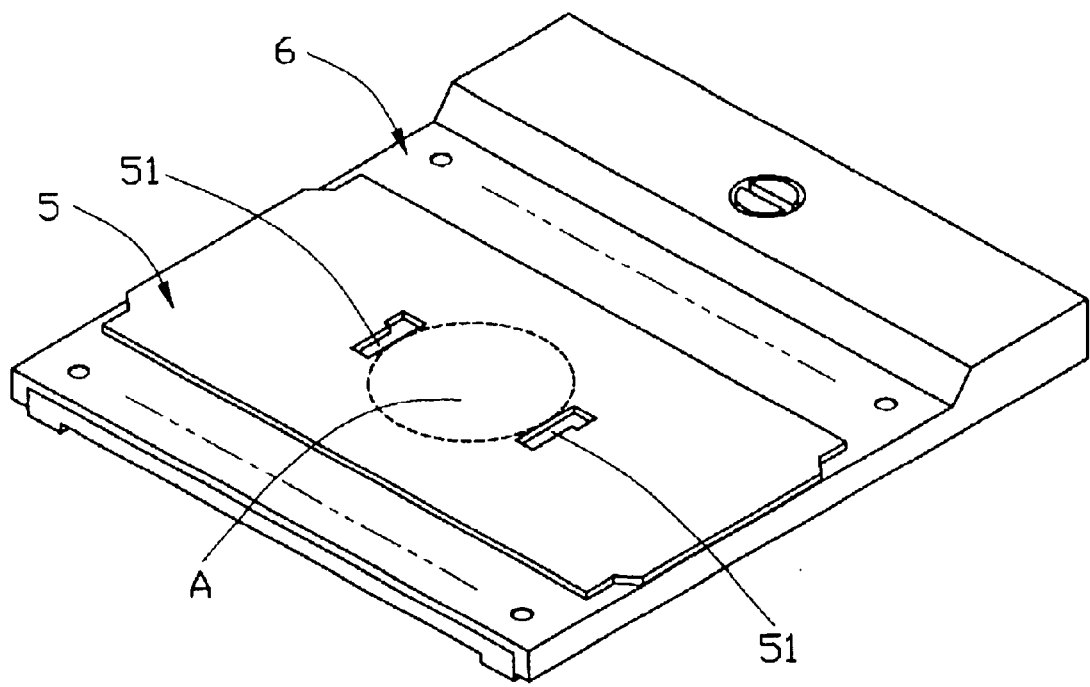
FIG. 5 is a perspective view of a socket and another related vacuum pickup cap attached to the socket.

Referring to FIGS. 2–3, the vacuum pickup cap 3 comprises a flexible bottom plate 31 and a transparent flexible film 32. The flexible bottom plate 31 is made of paper tape and comprises a sticky bottom surface 310 and a smooth upper surface 311. Similarly, the transparent flexible film 32 comprises a sticky bottom surface 320 and a smooth upper surface 321. In assembling, the sticky bottom surface 310 of flexible bottom plate 31 is adhered to the upper surface 210 of the cover 21 of the socket 2. Successively, the sticky bottom surface 320 of the transparent flexible film 32 is attached to the smooth upper surface 311 of the flexible bottom plate 31. The flexible bottom plate 31 may be dimensioned to cover just the through hole or the whole upper surface 210 of the cover 21.

The bottom plate 31, which covers the hole 200 is made of paper which is cheaper than the transparent film 32. The bottom plate 31 is given a sufficient thickness so it is strong enough to withstand the vacuum force of the pickup device acting on the pickup cap 3 on a region of the hole 200.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket assembly adapted for being sucked by a vacuum pickup device, comprising:
    a socket comprising:
        a base; and
        a cover being movably assembled upon the base and defining a through hole in a center thereof; and
    a vacuum pickup cap comprising:
        a flexible bottom plate having a sticky bottom surface adhered to an upper surface of the cover and covering the through hole of the cover; and
        a flexible film having a sticky bottom surface adhered to the flexible bottom plate and a smooth upper surface adapted for being sucked by the vacuum pickup device.

2. The socket assembly as described in claim 1, wherein the socket comprises an actuating rod assembled on both the base and the cover for driving the cover to move relative to the base.

3. The socket assembly as described in claim 1, wherein the bottom plate is made of paper.

4. An electrical connector assembly, comprising:
    an electrical connector adapted for electrically connecting an electronic device to a printed circuit board, the connector defining a hole therein; and
    a vacuum pickup cap mounted on the connector adapted for being sucked by a vacuum pickup device, comprising:
        a bottom plate attached to the connector and covering the hole; and
        a top film attached to the bottom plate; wherein the bottom plate is made of paper.

5. The electrical connector assembly as described in claim 4, wherein the bottom plate has a thickness which is larger than that of the top film.

6. The electrical connector assembly as described in claim 4, wherein the top film is transparent.

7. The electrical connector assembly as described in claim 4, wherein the bottom plate covers a whole area of a top surface of the connector.

8. An electrical connector comprising:
    an insulative housing defining therein a central large hole and a plurality of through holes surrounding said central large hole; and
    first and second stacked flexible layers applied on a top face of the housing; wherein
    the first layer is thicker/stronger than the second layer, said first layer cover and
    the second layer are at least partially overlapped with each other, and said first layer covers less area of said top face than said second layer, wherein both said first layer and said second layer have adhesive on bottom faces thereof, respectively.

9. The connector as described in claim 8, wherein an overlapped area between said first layer and said second layer covers said central hole.

10. The connector as described in claim 8, wherein said second layer is seated upon the first layer.

11. An electrical connector comprising:
    an insulative housing defining a central through hole around a gravity center thereof;
    first and second stacked flexible layers applied on a top face of the housing; wherein
    the first layer is thicker/stronger than the second layer, said first layer cover and the second layer are at least partially overlapped with each other above said central hole, and said first layer covers less area of said top face than said second layer, wherein both said first layer and said second layer are equipped with adhesive thereon, respectively.

12. The connector as described in claim 11, wherein said second layer is stacked upon said first layer.

13. The connector as described in claim 11, wherein said second layer is seated upon the first layer.

* * * * *